United States Patent [19]
Hsu

[11] Patent Number: 5,677,214
[45] Date of Patent: Oct. 14, 1997

[54] RAISED SOURCE/DRAIN MOS TRANSISTOR WITH COVERED EPITAXIAL NOTCHES AND FABRICATION METHOD

[75] Inventor: Sheng Teng Hsu, Camas, Wash.

[73] Assignees: Sharp Microelectronics Technology, Inc., Camas, Wash.; Sharp Kabushiki Kaisha, Osaka, Japan

[21] Appl. No.: 708,683

[22] Filed: Sep. 5, 1996

[51] Int. Cl.$^6$ .................................................. H01L 21/265
[52] U.S. Cl. .................................................. 437/41; 437/44
[58] Field of Search .................................................. 437/41, 44

[56] References Cited

U.S. PATENT DOCUMENTS

| | | | |
|---|---|---|---|
| 5,079,180 | 1/1992 | Rodder et al. | 437/41 |
| 5,183,771 | 2/1993 | Mitsui et al. | 437/44 |
| 5,242,847 | 9/1993 | Ozturk et al. | 437/41 |

OTHER PUBLICATIONS

Ghandhi, Sorab K. "VLSI Fabrication Priciples Silicon and Gallium Arsenide", Second Edition, John Wiley and Sons, Inc. month unknown 1994.

Article entitled, "Selective Germanium Epitaxial Growth on Silicon Using CVD Technology with Ultra-Pure Gases", by Shin-ichi Kobayashi, Min-Lin Cheng, Armin Kohlhase, Taketoshi Sato, Junichi Murota and Nobuo Mikoshiba printed in North-Holland Physics Publishing, Reprinted from Journal of Crystal Growth 99 (1990), pp. 259-262 month unknown.

*Primary Examiner*—John Niebling
*Assistant Examiner*—Michael S. Lebentritt
*Attorney, Agent, or Firm*—Gerald W. Maliszewski; David C. Ripma

[57] ABSTRACT

The invention provides a technique for forming a MOS transistor with reduced leakage current and a shorter channel length between source and drain electrodes. The transistor includes a gate electrode between raised source and drain electrodes that are formed from epitaxial silicon. Typically, the raised source and drain electrodes are thin where the intersect the gate electrode so that epitaxial notches are formed between the gate sidewall insulation and the source/drain electrodes. To protect the source/drain junction areas underlying the epitaxial notches from undesired penetration of doping impurities used in the fabrication of the electrodes, the notches are covered with insulation material. In a special process step, performed between forming the epitaxial layers and implanting the layers with dopants to form source and drain electrodes, insulation material is added to the initial, relatively thin, gate sidewalls that insulate the gate electrode from the source/drain electrodes. Any subsequent diffusion of doping impurities into the underlying source/drain junction areas occurs at a uniform rate so that the junction depth beneath the notches is not deeper than other regions of the junction areas. Thin uniform junction areas permit the channel length between source/drain electrodes to be shortened so that transistors may be packed more densely on a substrate. A raised source/drain MOS transistor with gate insulation sidewalls to fill epitaxial notches is also provided.

11 Claims, 3 Drawing Sheets

RAISED SOURCE/DRAIN MOS TRANSISTOR WITH COVERED EPITAXIAL NOTCHES AND FABRICATION METHOD

BACKGROUND AND SUMMARY OF THE INVENTION

This invention relates generally to semiconductor devices and fabrication methods and, more particularly, to a MOS transistor and fabrication method which minimizes junction leakage current and the channel leakage current between source and drain electrodes.

Metal oxide semiconductor (MOS) transistors are widely used in high density integrated circuits in part because MOS processing techniques yield high packaging densities. When fabricating MOS transistors, the source and drain electrodes are usually heavily doped to reduce the parasitic resistance of the device. Doping impurities implanted into the source and drain electrodes often diffuse into the junction areas underlying the source/drain and gate electrodes to increase the junction area depth. Junction areas having relatively large depths create two related problems, increased junction leakage current and channel punch through current. This condition is known as short channel effect and requires an increased channel length between source and drain electrodes.

When the MOS transistor is appropriately biased, the depletion edges of the source/drain space charge regions underlying the source/drain junction areas merge to conduct current. When the source/drain junction depths are relatively deep, the separation between the space charge regions decreases so that leakage current between the space charge regions is fostered, as is well known in the art. To alleviate the problem of leakage current, the channel length between source and drain electrodes is increased. That is, the gate electrode separating the source and drain electrodes must be made larger.

Raised source/drain electrodes have been developed for use in MOS transistors partially to solve the problems of gate electrode size and source/drain junction depths. Raised source and drain electrodes are essentially in the same horizontal plane as the gate electrode, since all three electrodes are deposited on the substrate. As a result of their proximity, the source/drain junction areas can be made to a shallower depth in the substrate. Ultimately, the shallower source/drain junction areas yield more widely separated source/drain space charge regions so that the susceptibility of the transistor to leakage current between junction areas is minimized.

One technique for forming raised source/drain electrodes is to deposit epitaxial silicon on the source/drain area of the substrate. Silicon is deposited, or grown, on the substrate, and typically takes on the crystalline structure of the underlying silicon substrate. However, the profile thickness of these epitaxial layers is not uniform. The epitaxial layer is generally thickest in its center with the thickness decreasing towards the edge. As noted in Kobayashi et al., "Selective Germanium Epitaxial Growth on Silicon using CVD Technology with Ultra-Pure Gases", in their discussion of epitaxial germanium, the shaping of epitaxial grown material is an ongoing problem in the industry.

When an epitaxial layer is deposited on a substrate, adjacent to a gate electrode, an area of minimum silicon thickness occurs at the edge of the source or drain electrode where it intersects the sidewalls of the gate electrode. This area of minimum thickness is called the epitaxial silicon notch, epi notch, or in this description it is sometimes called "the notch". After ion implantation into the source/drain electrodes, the diffusion of doping impurities into the junction areas is greater in the regions underlying the epitaxial notches. Therefore, the junction depth, or junction area thickness, is greater in the region underlying the notch than in the region underlying the center of the epitaxial silicon area. That is, doping impurities migrate through the epitaxial notch easier than through the center of the epitaxial layer causing a non-uniform junction thicknesses. These areas of deeper junction depths between the gate electrode and the source/drain electrodes more closely locate the source/drain space charge regions to induce the flow of leakage current. Building a raised source/drain MOS transistor with non-uniform junctions areas near the gate yields many of the same leakage current problems that this fabrication technique was developed to prevent.

It would be advantageous to provide a MOS transistor with shallow source and drain junction areas to reduce junction leakage current and minimize the short channel effect.

It would be advantageous to provide a MOS transistor with raised source and drain electrodes to further the reduction of the junction area depths underlying the source and drain electrodes.

It would be advantageous to provide a MOS transistor with raised source and drain electrodes fabricated to preserve uniform shallow junctions depths underlying the electrodes.

Accordingly, a MOS transistor is provided comprising a silicon substrate and a gate, including a gate insulation layer on the substrate, a gate electrode on the gate insulation layer, and first and second insulating sidewalls on opposite sides of the gate electrodes. Source and drain electrodes of epitaxial silicon are provided on opposite sides of the gate, the electrodes are shaped to have a maximum central thickness transitioning to a thinner edge thickness, an edge of the source and drain electrode being adjacent the gate such that the edge forms a notch of thin epitaxial silicon adjacent the gate. The insulating sidewalls of the gate are provided to include additional insulating sidewall material extending over the source and drain electrodes to cover the epitaxial notches, whereby the presence of doping impurities in the substrate, implanted through the epitaxial notches, it minimized to reduce leakage current.

In its preferred form, the MOS transistor of the present invention includes a silicide layer formed over the source and drain electrodes except where the additional gate sidewall material covers the epitaxial silicon notches, whereby the gate insulation sidewalls limit the penetration of silicide into the epitaxial notches. The silicide layers include metal selected from the group consisting of Cobalt, Tungsten, Titanium, and Nickel. In its preferred form, the silicide layer includes $CoSi_2$, and the thickness of the silicide layer is generally in the range of 40 to 80 nanometers (nm).

A method is also provided of forming a MOS transistor on a silicon substrate comprising the following steps: forming a gate, including gate insulation overlying the substrate, and a gate electrode overlying the gate insulation; forming insulating sidewalls on opposite sides of the gate electrode; forming a layer of epitaxial silicon over the substrate on opposite sides of the gate electrode, each epitaxial silicon region having a maximum central thickness transitioning to a thinner edge thickness, an edge of each epitaxial silicon region being adjacent the gate such that the edge forms a notch of thin epitaxial silicon adjacent the gate; and extending the gate insulation sidewalls to form thick sidewalls which cover the epitaxial notches, whereby the gate insulation sidewalls limit the access of doping impurities into the substrate areas underlying the epitaxial notches to control leakage current.

The method of the present invention provides the further step of implanting doping impurities into each epitaxial silicon region to form source and drain electrodes, whereby the implantation of doping impurities through the epitaxial notches is masked by the thick gate insulating sidewalls.

The addition of gate sidewall insulating material, deposited over the epitaxial notches of raised source/drain transistors, controls the implantation and diffusion of doping impurities through the epitaxial notches. As a result, the junction areas underlying the source and drain electrodes are produced to be both uniform and relatively thin. In this manner, full advantage can be taken of raised source/drain electrodes to reduce the leakage current in a MOS transistor. Additionally, relatively thin and uniform junctions areas permit the channel length between source and drain electrodes to be smaller in size, allowing the density of transistors on a substrate to increase.

DETAILED DESCRIPTION OF THE PREFERRED EMBODIMENT

Figure 1A:
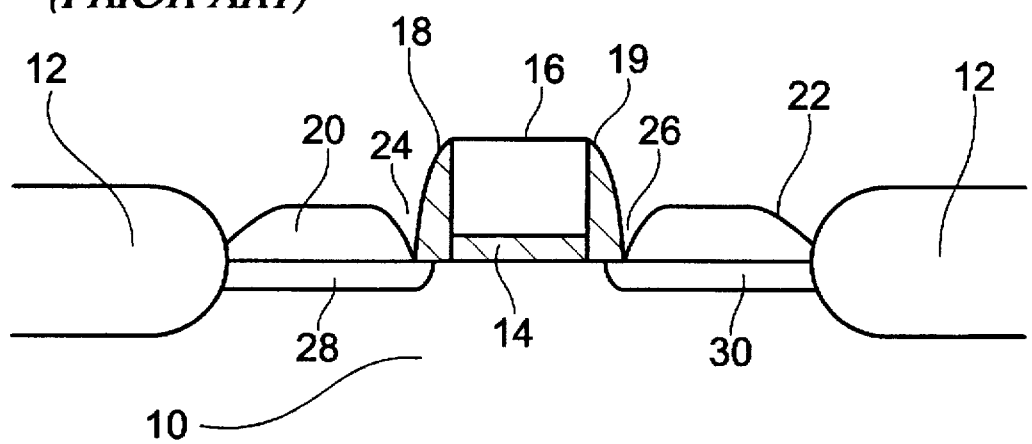
FIGS. 1a and 1b illustrate the non-uniform source/drain junction area depths of a prior art raised source/drain MOS transistor.
Figure 1B:
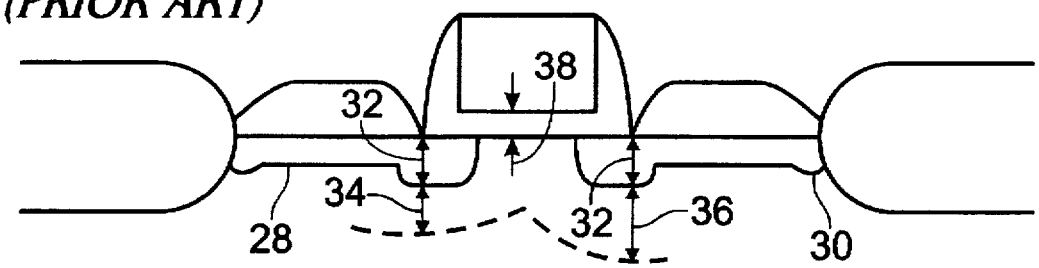

FIGS. 1a and 1b illustrate the non-uniform source/drain junction area depths of a prior art raised source/drain MOS transistor. Referring to FIG. 1a, the transistor is formed on a silicon substrate 10 and bounded by oxide insulating regions 12. A gate electrode insulating layer 14 overlies silicon substrate 10. A gate electrode 16 overlies gate insulating layer 14. A first 18 and a second 19 gate insulating sidewall are formed on opposite sides of a gate electrode 16. A raised source electrode 20 overlies substrate 10 between oxide insulator 12 and first gate insulating sidewall 18. Source electrode 20 is typically formed from a layer of epitaxial silicon. A drain electrode 22 of epitaxial silicon is located on the opposite side of gate electrode 16 between second gate insulating sidewall 19 and oxide insulator 12. The locations of source electrode 20 and drain electrode 22 are arbitrarily depicted. Alternately, the location of electrodes 20 and 22 may be transposed. A first epitaxial silicon notch 24 occurs between source electrode 20 and first gate insulating sidewall 18. A second epitaxial silicon notch 26 occurs between drain electrode 22 and second gate insulating sidewall 19.

A source junction area 28 generally underlies source electrode 20. A drain junction area 30 generally underlies drain electrode 22. Source electrode 20 and drain electrode 22 ore formed by the implantation of doping impurities, either n+ or p+, as is well known in the art. Likewise, the transistor depicted in FIGS. 1a and 1b may be either a n-channel or p-channel device.

FIG. 1b illustrates the prior art raised source/drain MOS transistor after implantation and diffusion of doping impurities through epitaxial notches 24 and 26. Regions of increased junction area thickness, create an effective source/drain junction depth 32, underlying notches 24 and 26. Increasing the source/drain junction depths 32 near gate electrode 16 results in more closely located source/drain space charge regions when the transistor is biased. The dotted line in FIG. 1b represents the space charge depletion edge when the transistor receives predetermined bias voltages on electrodes 16, 20, and 22. Under the predetermined bias conditions, the source space charge region has a width 34 generally underlying source electrode 28. The drain space charge region has a width 36 generally underlying drain electrode 30. Relatively wide space charge widths 34 and 36 result in less separation between source and drain space charge regions. A small separation between space charge regions, or short channel length, increases the likelihood of leakage current between source and drain space charge regions when the transistor is biased. Alternately, to decrease leakage current in the above described device, the size of gate electrode 16 must be increased to further the separation of junction areas 28 and 30, and therefore, lengthen the channel between space charge regions. Gate insulation 14, underlying gate electrode 16 has a thickness 38.

According to Brews et al., IEEE, EDL-1, p2, 1980, the minimum channel length is approximated with the following formula:

$$L=[r_j d(W_s+W_d)^2]^{1/3}$$

where

L=minimum channel length
$r_j$=source/drain junction depth 32
d=gate insulation thickness 38
$W_s$=source space charge width 34; and
$W_d$=drain space charge width 36

It can be seen from the above formula that the channel length can be minimized by reducing source/drain junction depth 32, gate insulation thickness 38, or space charge widths 34 and 36. Since the thinness of gate insulation 38 has practical limitations, the channel length must be reduced by working with the other variables. The diffusion of doping impurities through epitaxial notches 24 and 26 increases source/drain junction depth 32, and in turn, space charge widths 34 and 36. The diffusion of impurities through notches 24 and 26, therefore, increases the minimum channel length and leakage current.

Figure 2:
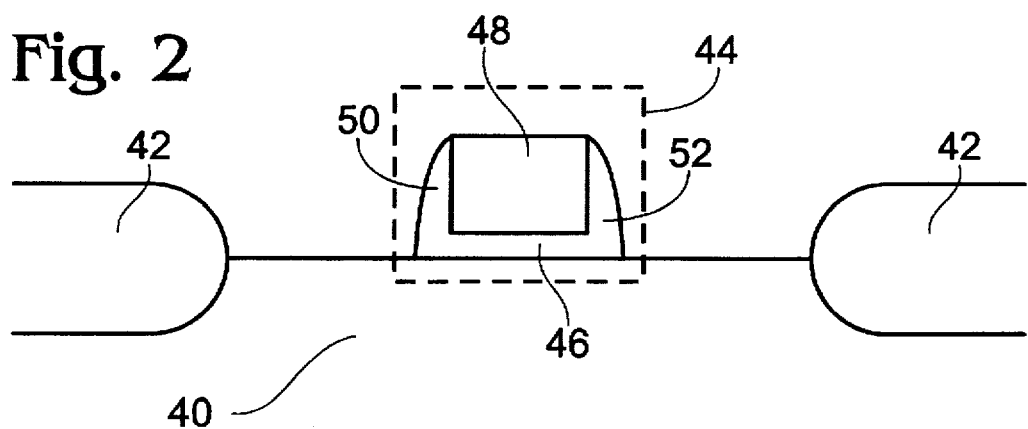
FIGS. 2–5 illustrate steps in the method of forming a completed raised source/drain MOS transistor of the present invention with gate insulating sidewalls extended to cover epitaxial notches between electrodes.

FIGS. 2–5 illustrate steps in the method of forming a completed raised source/drain MOS transistor of the present invention with gate insulating sidewalls extended to cover epitaxial notches between electrodes. FIG. 2 illustrates a MOS transistor comprising a silicon substrate 40 and oxide insulating areas 42. The MOS transistor also comprises a gate 44, including a gate insulation layer 46 on substrate 40, a gate electrode 48 on gate insulation 46, and a first 50 and a second 52 insulating sidewall on opposite sides of gate electrode 48.

The transistor in FIG. 2 also depicts a partially fabricated transistor after the occurrence of three main process steps. Insulator 46 is, first, deposited on substrate 40. Second, a silicon deposit, typically a polycrystalline silicon, is etched in preparation of becoming gate electrode 48. Third, thin oxide sidewalls 50 and 52 have been formed on gate 44 for insulation of gate electrode 48.

Figure 3:
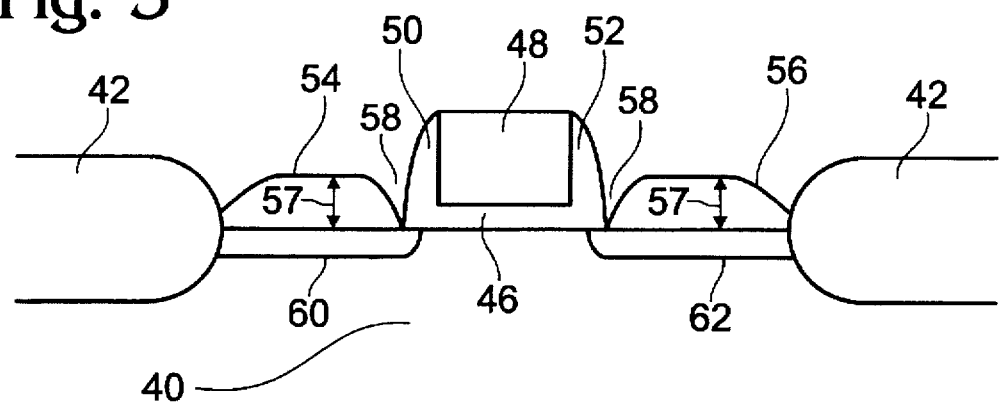

FIG. 3 illustrates the MOS transistor of FIG. 2 further comprising source 54 and drain 56 electrodes of epitaxial silicon on opposite sides of gate 44, the electrodes are shaped to have a maximum central thickness 57 transitioning to a thinner edge thickness, an edge of each source 54 and drain 56 electrode being adjacent gate 44 such that the edge forms notches 58 of thin epitaxial silicon adjacent gate 44.

Source/Drain electrodes 54 and 56 are fabricated with either n+ or p+ doping impurities as is well known in the art. Further, the description of the transistor of the present invention is applicable to either n-channel of p-channel. The location of source 54 and drain 56 electrodes is arbitrary, their positions are transposable.

The transistor of FIG. 3 also depicts the partially fabricated transistor of FIG. 2 after two addition main process steps. First, the area on either side of gate 44, generally under the yet to be formed source 54 and drain 56 electrodes, receives a light doping implantation to form a source junction area 60 and a drain junction area 62. Second, epitaxial layers of silicon are grown selectively on substrate 40 in preparation of creating electrodes 54 and 56. Although more practical applications occur with regard to epitaxial silicon, the process and transistor of the present invention work equally well with selectively grown epitaxial silicon or deposited silicon. Alternately, the light doping implantation process step to form junction areas 60 and 62 is performed before the formation of sidewalls 50 and 52.

Figure 4:
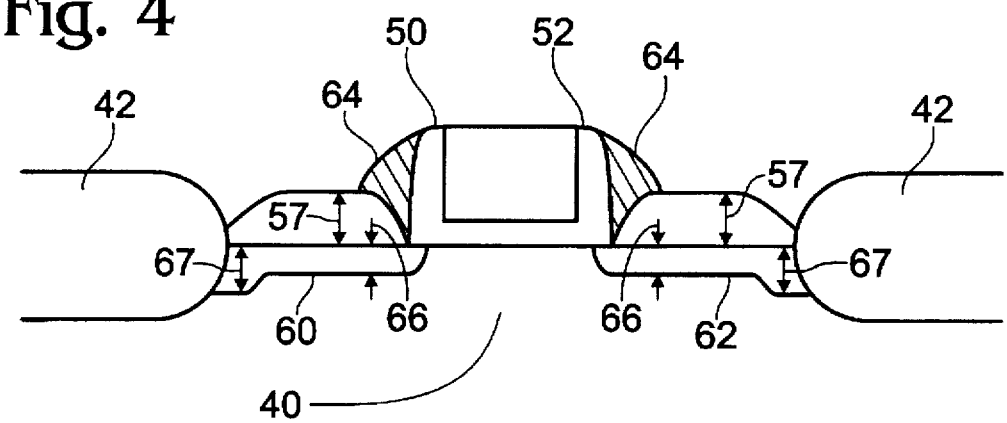

FIG. 4 is the MOS transistor of FIG. 3 further comprising insulating sidewalls 50 and 52 of gate 44 including additional insulating sidewall material 64 extending over source 54 and drain 56 electrodes to cover epitaxial notches 58, whereby the presence of doping impurities in substrate 40, implanted through epitaxial notches 58, is minimized to reduce leakage current.

The transistor of FIG. 4 also depicts the partially fabricated transistor of FIG. 3 after two addition process steps. Erst, addition oxide is added to sidewalls 50 and 52 to form extended gate sidewall insulators 64. Second, epitaxial layers 54 and 56 are implanted with doping impurities to from source 54 and drain 56 electrodes.

Figure 5:
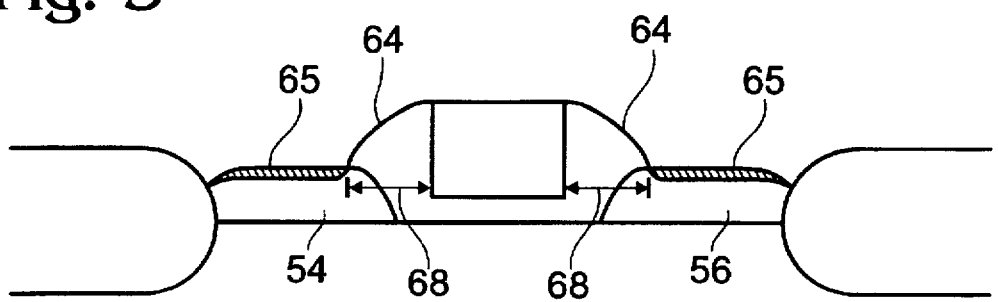

FIG. 5 illustrates the MOS transistor of the present invention after the process step of forming a silicide layer 65. In a preferred embodiment, the MOS transistor of the present invention includes silicide layer 65 formed over source 54 and drain 56 electrodes except where additional gate sidewall material 64 covers epitaxial silicon notches 58, whereby gate insulation sidewalls 64 limit the penetration of silicide into epitaxial notches 58. A layer of silicide on source 54 and drain 56 electrodes increases the conductivity of electrical current through electrodes 54 and 56. The higher conductivity through electrodes 54 and 56 permits shallower source/drain junction depths 66 to reduce leakage current, as is well known in the art. However, silicide is formed in combination with a predetermined surface thickness of silicon electrodes 54 and 56. The loss of silicon along the thin edge of electrodes 54 and 56 to form silicide layer 65, therefore, promotes the formation of even deeper epitaxial notches 58. In this manner, the formation of a silicide layer on electrodes 54 and 56 increases the susceptibility of junction areas 60 and 62 to doping impurities in subsequent processing steps, unless epitaxial notches 58 are masked.

The MOS transistor and method of the present invention applies equally to the formation of a layer of salicide, or self-aligning sillicide on source 54 and drain 56 electrodes. As is well known in the art, silicide will typically only be produced in combination with silicon. In performing a salicide process, the transistor of FIG. 5 is coated with metal and rapid thermal processed to yield a selective silicide layer that is identical to silicide layer 65. In addition, performing a salicide process on the transistor of FIG. 5 would also result in silicide layer (not shown) covering gate electrode 48, which is desirable in many situations. For clarity, the more general term of silicide is used in the description of the present invention.

The silicide layers include metal selected from the group consisting of Cobalt, Tungsten, Titanium, and Nickel. In the preferred embodiment of the present invention, the silicide layer includes $CoSi_2$, and the thickness of the silicide layer is generally in the range of 40 to 80 nm.

Referring again to FIG. 4, in a preferred embodiment, the MOS transistor of the present invention further comprises lightly doped junction areas 60 and 62 in substrate 40 generally underlying source 54 and drain 56 electrodes to form junction areas 60 and 62 having a uniform thickness 66, whereby the implantation and diffusion of doping impurities into junction areas 60 and 62, through epitaxial notches 58, is limited by gate insulation sidewalls 64. Source junction 60 generally underlies source electrode 54, and drain junction 62 generally underlies drain electrode 56. Uniform junction area thickness 66, as used herein, refers to depth of source 60 and drain 62 junction areas in the regions near gate 44 that effect the shape and width of the space charge regions (not shown). Areas of increased thickness 67 in source 60 and drain 62 junction areas near oxides barriers 42 have relatively no effect on the width of the space charge region when the transistor is biased, and so, do not effect leakage current. Areas of increased thickness 67 are, therefore, not considered in defining the uniform thickness 66 of source 60 and drain 62 junctions.

In a preferred embodiment, the MOS transistor of the present invention includes junction areas 60 and 62 having thickness 66 generally in the range of 10 to 100 nm, whereby relatively thin junction areas 60 and 62 permit the use of a short channel length between source junction area 60 and drain junction area 62.

Still referring to FIG. 4, the MOS transistor of the present invention includes central thickness 57 of source 54 and drain 56 electrodes being in the range to 40 to 70 nm. Source 54 and drain 56 epitaxial silicon is selected from the group consisting of single crystalline and polycrystalline silicon.

In a preferred embodiment, the MOS transistor of the present invention includes first 50 and second 52 gate insulating sidewalls having a thickness in the range of 10 to 50 nm, and additional insulating sidewall material 64 extending over notches 58 yields gate insulating sidewalls having a maximum thickness 68 generally in the range of 100 to 300 nm, as shown in FIG. 5.

Figure 6:
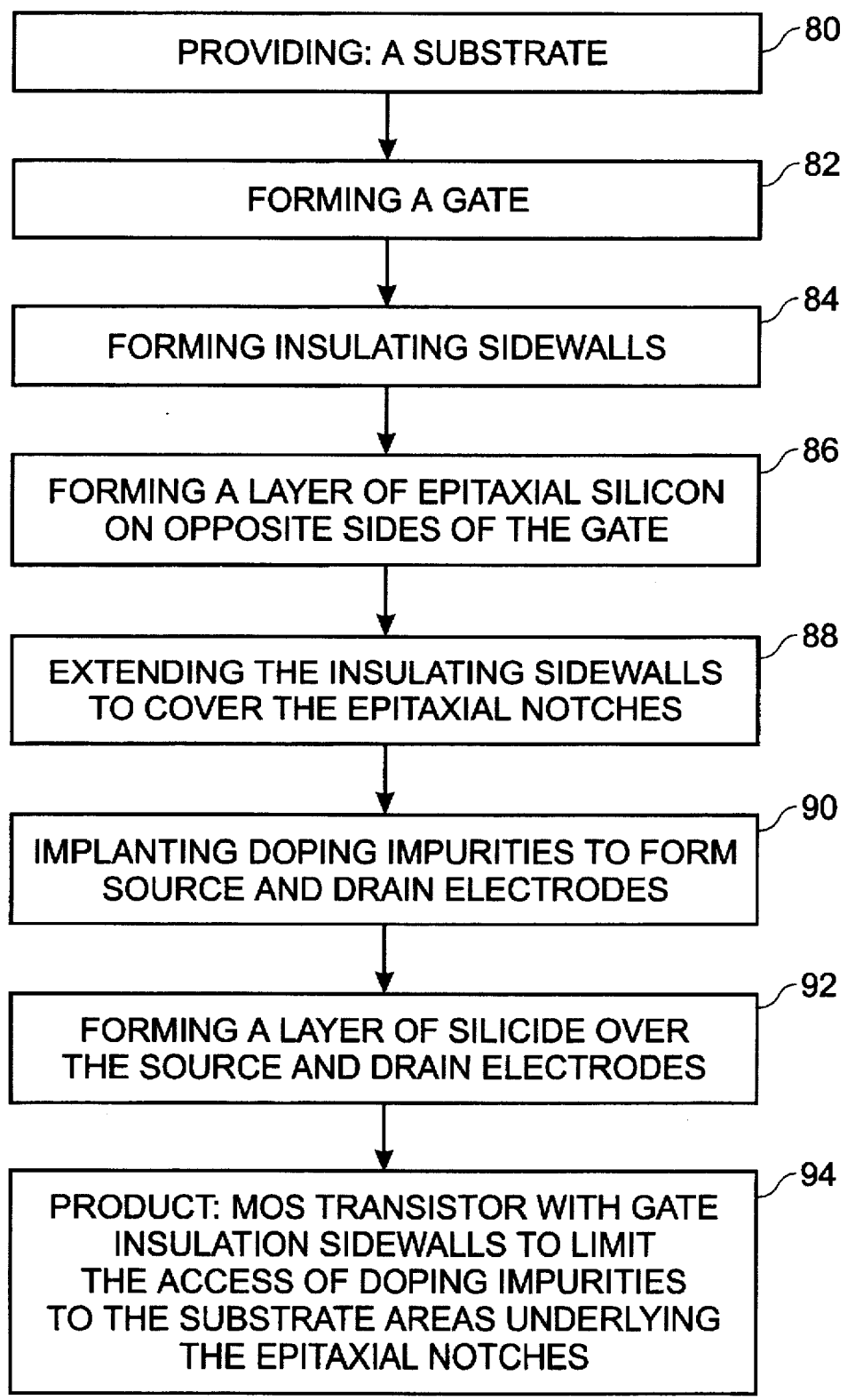
FIG. 6 is a flow chart illustrating the steps in the method of processing a raised source/drain MOS transistor with gate insulating sidewalls extended to cover epitaxial notches between electrodes.

FIG. 6 is a flow chart illustrating the steps in the method of processing a raised source/drain MOS transistor with gate insulating sidewalls extended to cover epitaxial notches between electrodes. Step 80 provides a silicon substrate on which the MOS transistor is fabricated. Step 82 forms a gate, including gate insulation overlying the substrate, and a gate electrode overlying the gate insulation. Step 84 forms insulating sidewalls on opposite sides of the gate electrode. Step 86 forms a layer of epitaxial silicon over the substrate on opposite sides of the gate electrode, each epitaxial silicon region having a maximum central thickness transitioning to a thinner edge thickness, and an edge of each epitaxial silicon region being adjacent the gate such that the edge forms a notch of thin epitaxial silicon adjacent the gate. The epitaxial silicon can either be single crystalline or polycrystalline. Further, the process works equally well with deposited silicon. Step 88 extends the gate insulating sidewalls, initially formed in Step 84, to form thick sidewalls which cover the epitaxial notches formed in Step 86.

In a preferred embodiment, the method of the present invention includes a further Step 90, following Step 88, of implanting doping impurities into each epitaxial silicon region formed in Step 86 to form source and drain electrodes, whereby the implantation of doping impurities through the epitaxial notches is masked by the thick gate insulating sidewalls formed in Step 88.

In a preferred embodiment, the method of the present invention includes a further Step 92, following Step 90, of forming a layer of silicide over the source and drain electrodes except in the areas where the thick gate insulating sidewalls formed in Step 88 cover the epitaxial notches, whereby the penetration of silicide into the epitaxial notches is limited. The formation of a silicide layer in Step 92 includes selecting metal from the group consisting of Cobalt, Tungsten, Titanium, and Nickel. In one embodiment, the forming of a silicide layer in Step 92 includes depositing a layer of cobalt generally having a thickness of 10 to 40 nm, and rapid thermal processing the silicide at a temperature generally in the range of 500° C. to 550° C. for 10 to 30 seconds.

Step 94 is the MOS transistor product, where the gate insulation sidewalls limit the access of doping impurities into the substrate areas underlying the epitaxial notches to control leakage current.

In one preferred embodiment of the present invention, Step 90 of implanting doping impurities into the epitaxial silicon region, includes rapid thermal annealing at a temperature generally in the range of 800° C. to 1,150° C. for one to three hours to diffuse the doping impurities through the source and drain electrodes. In the preferred embodiment, Step 90 includes implanting impurities at an energy level generally in the range of 30 to 60 keV with a dose generally in the range of 2 to $5 \times 10^{15}$ ions/cm$^2$.

In a preferred embodiment, the method of the present invention includes the further step, following Step 82, of implanting the substrate areas covered by the epitaxial silicon in Step 86 with a light doping of impurities to form source and drain junction areas. A further step is included, before Step 86, of implanting the substrate underlying the epitaxial silicon regions formed in Step 86, on opposite sides of the gate electrode, with doping impurities at an energy level generally in the range of 10 to 15 keV and a dose generally in the range of 5 to $10 \times 10^{13}$ ions/cm$^2$ to form source and drain junction areas.

The MOS transistor of the present invention minimizes leakage current between source and drain electrodes and thereby reduces the channel length between source and drain electrodes. The gate electrodes of transistors built according to the method of the present invention can be reduced in size, thus allowing a greater density of transistors to be packaged on a substrate. Additional gate insulation sidewall material 64 is used to cover epitaxial notches 58 formed between gate 44 and source 54 and drain 56 electrodes. Additional sidewall material 64 controls the implantation and diffusion of impurities through epitaxial notches 58. As a result, junction area 60 and 62 are fabricated with a relatively thin depth 66 that remains uniform in the critical areas near gate electrode 48 through the entire fabrication process. The process is especially useful when silicide layers, and other process which promote the growth of epitaxial notches 58, are used in subsequent fabrication processes.

As noted above in the discussion of the method of the present invention, the MOS transistor can be fabricated as either an n-channel or a p-channel device, depending on the type of semiconductor material and doping impurities employed. As will be readily understood, the designation of the source and drain in the foregoing description is arbitrary and the designations of the those electrodes may be reversed. The transistor and process of the present invention can be applied to other materials, and other epitaxial grown materials such as Germanium. Other variations within the scope of the present invention will occur to those skilled in the art.

What is claimed is:

1. A method of forming a MOS transistor on a silicon substrate comprising the following steps:
   a) forming a gate, including gate insulation overlying the substrate, and a gate electrode overlying the gate insulation;
   b) forming insulating sidewalls on opposite sides of the gate electrode;
   c) forming a layer of epitaxial polycrystalline silicon over the substrate to form epitaxial polycrystalline silicon regions on opposite sides of the gate electrode, each epitaxial polycrystalline silicon region having a maximum central thickness transistioning to a thinner edge thickness, an edge of each epitaxial polycrystalline silicon region being adjacent the gate such that the edge forms a notch of thin epitaxial polycrystalline silicon adjacent the gate;
   d) extending the gate insulating sidewalls, initially formed in step b), to form thick sidewalls which cover the epitaxial notches formed in step c); and
   e) implanting doping impurities into each epitaxial polycrystalline silicon region formed in step c) to form source and drain electrodes, whereby the implantation of doping impurities through the epitaxial notches is masked by the thick gate insulating sidewalls formed in step d).

2. A method as in claim 1 including the further step, following step e) of:
   f) forming a layer of silicide over the source and drain electrodes except in areas where the thick gate insulating sidewalls formed in step d) cover the epitaxial notches, whereby the penetration of silicide into the epitaxial notches is limited.

3. A method as in claim 2 in which the step f), of forming silicide layers, includes depositing a layer of cobalt having a thickness of 10 to 40 nm, and rapid thermal processing the silicide at a temperature in the range of 500° C. to 550° C. for 10 to 30 seconds.

4. A method as in claim 1 in which the step e), of implanting doping impurities into the epitaxial polycrystalline silicon regions includes rapid thermal annealing at a temperature in the range of 800° C. to 1150° C. for 1 to 3 hours to diffuse the doping impurities through the source and drain electrodes.

5. A method as in claim 4 in which the step e), of implanting doping impurities into the epitaxial polycrystalline silicon regions, includes implanting impurities at an energy level in the range of 30 to 60 keV with a dose in the range of 2 to $5 \times 10^{15}$ ions/cm$^2$.

6. A method as in claim 1 including the further step, following step a), of implanting the substrate areas covered by the epitaxial polycrystalline silicon in step c) with a light doping of impurities to form source and drain junction areas.

7. A method as in claim 1 including the further step, before step c), of:
   implanting the substrate underlying the epitaxial polycrystalline silicon regions formed in step c) with doping impurities at an energy level in the range of 10 to 15 keV and a dose in the range of 5 to $10 \times 10^{13}$ ions/cm$^2$ to form source and drain junction areas.

8. A method as in claim 1 in which the step b), of forming gate insulation sidewalls, includes forming sidewalls having a thickness in the range of 10 to 50 nm, and in which step d), of extending the sidewalls formed in step b) to cover the epitaxial notches, includes forming sidewalls having a maximum thickness in the range of 100 to 300 nm.

9. A method as in claim 1 in which the step c), of forming epitaxial polycrystalline silicon regions, includes forming the regions to have a maximum central thickness in the range of 40 to 70 nm.

10. A method of forming a MOS transistor on a silicon substrate comprising the following steps:

a) forming a gate, including gate insulation overlying the substrate, and a gate electrode overlying the gate insulation;

b) forming insulating sidewalls on opposite sides of the gate electrode;

c) implanting the substrate regions on opposite sides of the gate electrode with doping impurities at an energy level in the range of 10 to 15 keV and a dose in the range of 5 to $10 \times 10^{13}$ ions/cm$^2$ to form source and drain junction areas;

d) forming a layer of epitaxial polycrystalline silicon over the substrate to form epitaxial polycrystalline silicon regions on opposite sides of the gate electrode and overlying the substrate regions implanted in step c), each epitaxial polycrystalline silicon region having a maximum central thickness transistioning to a thinner edge thickness, an edge of each epitaxial polycrystalline silicon region being adjacent the gate such that the edge forms a notch of thin epitaxial polycrystalline silicon adjacent the gate;

e) extending the gate insulating sidewalls initially formed in step b) to form thick sidewalls which cover the epitaxial notches formed in step d); and f) implanting doping impurities into each epitaxial polycrystalline silicon region formed in step d) at an energy level in the range of 30 to 60 keV with a dose in the range of 2 to $5 \times 10^{15}$ ions/cm$^2$ to form source and drain electrodes, whereby the gate insulation sidewalls limit the access of doping impurities to the substrate underlying the epitaxial notches to maintain a uniform junction area thickness, control leakage current, and limit the short channel effect.

11. A method as in claim 10 including the further step, following step f), of:

g) forming a layer of silicide over the source and drain electrodes formed in step f), whereby the penetration of silicide into the epitaxial notches is limited by the extended gate insulating sidewalls formed in step e).

* * * * *